(12) United States Patent
Yamasaki et al.

(10) Patent No.: US 6,222,339 B1
(45) Date of Patent: Apr. 24, 2001

(54) SYSTEM AND METHOD FOR CONTROLLING ATTITUDE OF SUBSTRATE

(75) Inventors: Katuki Yamasaki, Fukuoka-ken; Shigeru Kimura, Shiga-ken, both of (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 09/324,795

(22) Filed: Jun. 3, 1999

(30) Foreign Application Priority Data

Jun. 4, 1998 (JP) .................................................. 10-155769

(51) Int. Cl.[7] .................................................. H01L 21/68
(52) U.S. Cl. ........................... 318/685; 414/777; 414/936
(58) Field of Search .................................... 318/603, 652, 318/685, 696; 414/754, 757, 777, 936, 938

(56) References Cited

U.S. PATENT DOCUMENTS

| | | | |
|---|---|---|---|
| 4,970,772 | * 11/1990 | Steere, III | 29/271 |
| 5,028,200 | * 7/1991 | Shimane | 414/757 |
| 5,102,291 | * 4/1992 | Hine | 414/786 |
| 5,533,243 | * 7/1996 | Asano | 29/25.01 |
| 5,853,284 | * 12/1998 | Ohzeki et al. | 414/757 |
| 5,970,818 | * 10/1999 | Kikuchi et al. | 74/526 |
| 5,980,195 | * 11/1999 | Miyashita | 414/783 |
| 6,052,913 | * 4/2000 | Kaneko et al. | 33/645 |

* cited by examiner

*Primary Examiner*—Bentsu Ro
(74) *Attorney, Agent, or Firm*—Morrison & Foerster

(57) ABSTRACT

A principal part of an attitude control system comprises: holding means 30 for holding wafers W so that the wafers W are rotatable in circumferential directions; rotation transmitting means 40 for contacting a peripheral portion of each of the wafers W to rotate the wafers W; a stepping motor 50 for rotating the wafers W; transmission switching means 60 for selectively transmitting a power from the stepping motor 50 to the rotation transmitting means 40; a photo sensor 70 for detecting a notch Wa formed in the peripheral portion of each of the wafers W; and a CPU 80 for controlling the operations of the stepping motor 50 and the transmission switching means 60 on the basis of a detection signal outputted from the photo sensor 70. Thus, the notch Wa of each of the rotating wafers W is detected, and the stepping motor 50 and the transmission switching means 60 are controlled on the basis of the detection signal, so that it is possible to carry out the positioning of the wafers W. Thus, it is possible to provide a substrate-attitude control system capable of preventing dust from being produced to reduce the wear of a driving part to enhance the reliability of the system.

25 Claims, 13 Drawing Sheets

SYSTEM AND METHOD FOR CONTROLLING ATTITUDE OF SUBSTRATE

BACKGROUND OF THE INVENTION

1. Field of the Invention

The present invention relates generally to a system and method for controlling the attitude of a substrate. More specifically, the invention relates to a system and method for controlling the attitude of a disk-shaped substrate, such as a semiconductor wafer, an LCD glass wafer, a photo-magnetic disk, a compact disk and a minidisk.

2. Related Background Art

In a typical production process for a semiconductor equipment, there is widely adopted a substrate treatment system for sequentially transporting disk-shaped substrates (which will be hereinafter referred to as "wafers"), such as semiconductor wafers, which are to be treated, to a cleaning bath, in which a treatment solution, such as a chemical and a rinsing solution (a cleaning solution), is stored, and a drying section to clean and dry the substrates.

In order to efficiently clean a plurality of wafers, e.g., 50 wafers, using such a substrate treatment system, there is preferably adopted a method for transporting a plurality of wafers, e.g., 50 wafers, while causing the wafers to have the same attitude, i.e., while vertically arranging the wafers at regular intervals, by means of a wafer delivery unit, which is provided in a wafer delivery section provided between a wafer introducing/discharging section and a treatment section, and for carrying the wafers in and out of each of treatment units.

Therefore, there is known a conventional wafer attitude control system shown in FIG. 13. This wafer attitude control system comprises: a driving shaft b, which extends in directions of arrangement of a plurality of wafers W and which has a diameter so as to be receivable in a notch (a positioning notch) a for contacting the lower portion of the outer peripheral portion of each of the plurality of wafers W due to the weight of the wafers W to rotate the wafers W; idle pulleys c, each of which is rotatably provided so as to correspond to each of the plurality of wafers W and each of which is associated with the driving shaft b for supporting the corresponding wafer W to rotate in accordance with the rotation of the corresponding wafer W; and stoppers d, each of which contacts the outer peripheral portion of each of the wafers W moved downward due to gravity when the position of the notch a corresponds to the position of the driving shaft b after each of the wafers W is rotated, and each of which is associated with the corresponding idle pulley c to support the corresponding wafer W so that the driving shaft b does not contact the inner surface of the notch a of the corresponding wafer W (see Japanese Patent Laid-Open No. 6-345208).

However, in such a conventional system, the wafers W are rotated by the driving shaft b for a predetermined period of time to allow the notches a to engage the driving shaft b to align the notches a. Therefore, even after the notch a of one of the wafers W is arranged at a predetermined position, when the notches a of other wafers W are not aligned with each other, the driving shaft b remains rotating with respect to the wafer W, the notch a of which has been arranged at the predetermined position, until the notches a of all of the wafers W are aligned with each other. Therefore, the driving shaft b contacts the outer peripheral portions or notches a of a number of wafers W until the notches a of all of the wafers W are aligned with each other. Consequently, there is a problem in that dust is produced to be splashed to adhere to the wafers W. In addition, since the driving shaft b is thin, it is easily worn down, so that there is a problem that the wear of the driving shaft b does not only obstruct the rotation of the wafers W, but it also obstructs the attitude control of the wafers W.

Such problems are common to the positioning of disk-shaped substrates other than the wafers W, such as photo-magnetic disks or compact disks.

SUMMARY OF THE INVENTION

It is therefore an object of the present invention to eliminate the aforementioned problems and to provide a substrate-attitude control system and method which can prevent dust from being produced to reduce the wear of a driving part to enhance the reliability of the system.

In order to accomplish the aforementioned and other objects, according to the present invention, when the positioning notches of a plurality of substrates are aligned, it is detected that the positioning notch of a certain substrate is arranged at a predetermined position, so as to individually prevent the substrate, which has been arranged at the predetermined position, from being unnecessarily rotated. Thus, it is possible to prevent the substrate, which has been arranged at the predetermined position, from being unnecessarily rotated until all of the substrates are aligned, so that it is possible to decrease the opportunity to produce friction between the substrates and rotating means.

According to one aspect of the present invention, a substrate-attitude control system comprises: holding means for holding a plurality of disk-shaped substrates so that the substrates are rotatable in circumferential directions; rotation transmitting means for contacting a peripheral portion of each of the substrates to rotate the substrates; a rotation driving source for rotating the substrates; transmission switching means for selectively transmitting a power from the rotation driving source to the rotation transmitting means so as to be capable of switching transmission/non-transmission; detecting means for detecting a positioning notch formed in the peripheral portion of each of the substrates; and control means for controlling the operation of the transmission switching means on the basis of a detection signal outputted from the detecting means.

The control means may be capable of controlling the operation of the rotation driving source. The rotation transmitting means may be integral with the transmission switching means.

Preferably, the holding means comprises one or a plurality of holding rods having holding grooves for holding the substrates so that the substrates are able to be supported in the holding grooves of at least one of the holding rods.

The holding means may comprise one or a plurality of holding rods, each of which has a plurality of holding grooves for holding the substrates at regular intervals so that the substrates are able to be supported in the holding grooves of at least one of the holding rods; the rotation transmitting means may comprise a first rotation transmitting roller group comprising a plurality of transmission rollers for independently transmitting rotation to the substrates in odd rows, and a second rotation transmitting roller group comprising a plurality of transmission rollers for independently transmitting rotation to the substrate in even rows; the transmission switching means may comprise switching rollers, each of which is capable of selectively contacting a corresponding one of the transmission rollers of the first and second rotation transmitting roller groups, and a moving mechanism for moving the switching rollers so that each of the switching rollers contacts or leaves the corresponding one of the transmission rollers; and the detecting means may comprise a plurality of sensors for detecting the positioning notch formed in the peripheral portion of each of the substrates. In this case, the substrate-attitude control system preferably includes an intermediate roller, provided between the first and second rotation transmitting roller groups and the switching rollers of the transmission switching means, for contacting the transmission rollers of the first and second rotation transmitting roller groups and the switching rollers.

The holding means may comprise one or a plurality of holding rods, each of which has a plurality of holding grooves for holding the substrates at regular intervals so that the substrates are able to be supported in the holding grooves of at least one of the holding rods; the rotation transmitting means comprises a rotation transmitting roller group comprising a plurality of transmission rollers for independently transmitting rotation to the substrates; the transmission switching means comprises switching rollers, each of which selectively contacts a corresponding one of the transmission rollers of the rotation transmitting roller groups so as to be able to switch transmission/non-transmission, and a moving mechanism for moving the switching rollers so that each of the switching rollers contacts or leaves the corresponding one of the transmission rollers; and the detecting means comprises a plurality of sensors for detecting the positioning notch formed in the peripheral portion of each of the substrates. In this case, the substrate-attitude control system preferably includes an intermediate roller, provided between the rotation transmitting roller group and the switching rollers of the transmission switching means, for contacting the transmission rollers of the rotation transmitting roller group and the switching rollers.

Preferably, the holding means comprises a plurality of holding rods, at least one of which has holding grooves for supporting thereon the substrates, each of the holding grooves of the at least one of the holding rods having a substantially V-shaped cross section, and each of the other holding rods having holding grooves, each of which has a substantially Y-shaped cross section.

Preferably, substrate-attitude control system further comprises drive transmitting means which is provided between the rotation driving source and the transmission switching means and which is driven by the rotation driving source via a funis.

Preferably, the rotation driving source comprises a stepping motor.

According to another aspect of the present invention, a substrate-attitude control method comprises the steps of: rotating a disk-shaped substrate in circumferential directions; detecting a positioning notch formed in a peripheral portion of the substrate; and switching transmission switching means, which transmits a power from rotation driving means to the substrate, to stop rotation of the substrate on the basis of a signal outputted by the detection.

In this case, preferably, after the positioning notch of the substrate is detected, a predetermined number of pulses are transmitted to a rotation driving source to rotate the substrate by an angle corresponding to the predetermined number of pulses, and thereafter, the transmission switching means is switched to stop rotation of the substrate.

Alternatively, preferably, after rotation of the substrate is stopped on the basis of a detection signal, the substrate is rotated again, and a predetermined number of pulses are transmitted to a rotation driving source to rotate the substrate by an angle corresponding to the predetermined number of pulses, and thereafter, the transmission switching means is switched to stop rotation of the substrate or to stop the rotation driving source.

According to a further aspect of the present invention, a substrate-attitude control method comprises the steps of: rotating a plurality of disk-shaped substrates in circumferential directions; detecting a positioning notch formed in a peripheral portion of each of the substrates; and switching transmission switching means, which transmits a power from rotation driving means to each of the substrates, to stop rotation of each of the substrates on the basis of a signal outputted by the detection, wherein rotation of a final substrate of the substrates is stopped by switching the transmission switching means or by stopping the rotation driving source.

In this case, preferably, after the positioning notch of each of the substrates is detected, the rotation driving source is driven by a predetermined number of pulses to rotate each of the substrates to a predetermine position, and thereafter, the transmission switching means is switched to stop rotation of each of the substrates.

Alternatively, preferably, after rotation of all of the substrates is stopped on the basis of a detection signal, all of the substrates are rotated again, and a predetermined number of pulses are transmitted to the rotation driving source to switch the transmission switching means to stop rotation of all of the substrates or to stop the rotation driving means.

According to the substrate-attitude control system and method having the above described constructions, the rotation transmitting means is operated by the rotation driving source to rotate the substrates, which are held by the holding means, in circumferential directions. On the other hand, the positioning notches formed in the substrates are detected by the detecting means, and the rotation driving source is rotated by a predetermined angle on the basis of the detection signal thereof. Thereafter, the drive transmission performed by the transmission switching means is stopped, or the rotation driving source is stopped, so that it is possible to align the positioning notches of the substrates to a predetermined position.

In addition, since it is possible to arrange the rotation driving source at a position apart from the substrates, and since it is possible to position the substrates by stopping the drive transmission performed by the transmission switching means or by stopping the rotation of the drive transmitting means, it is possible to prevent dust from being produced and it is possible to reduce the wear of the rotation driving source.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of the present invention will be described in detail below. In the preferred embodiments, a substrate-attitude control system according to the present invention is applied to a cleaning system for semiconductor wafers.

Figure 1:
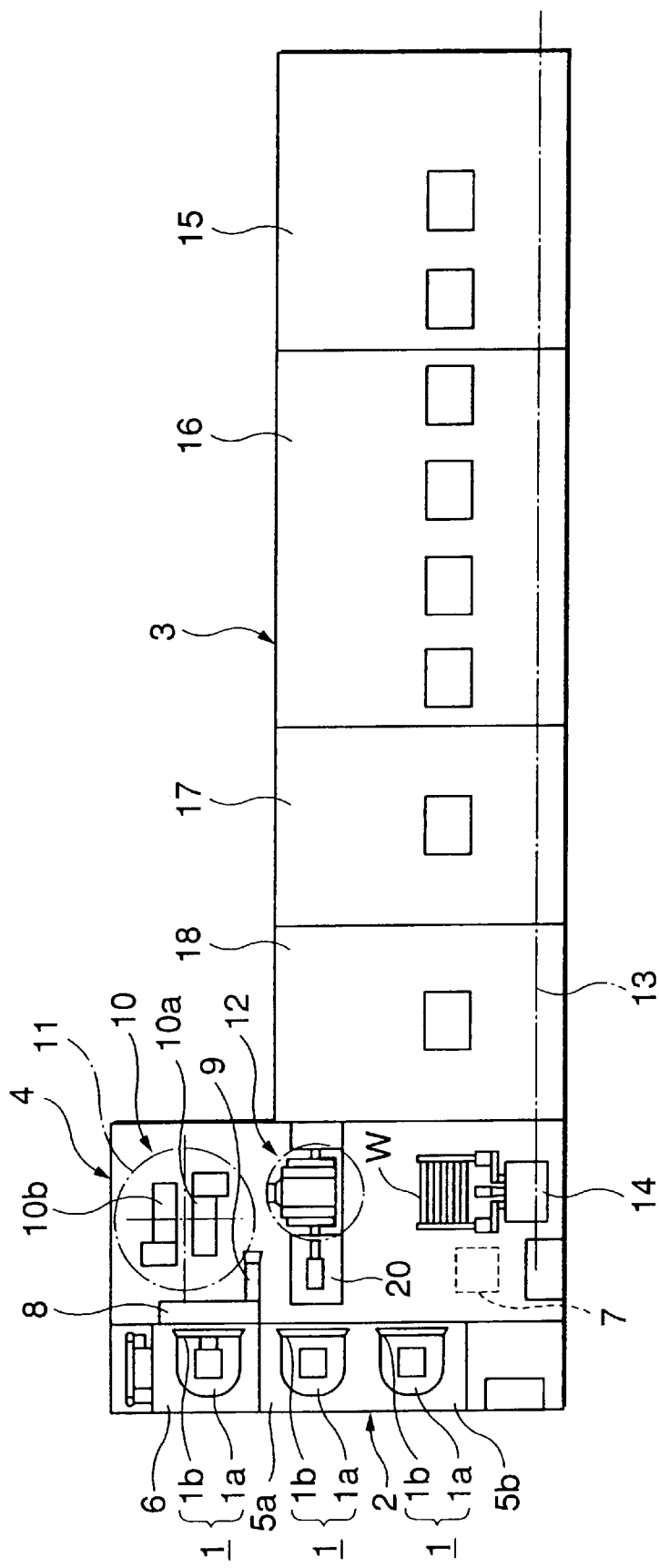
FIG. 1 is a schematic plan view of an example of a cleaning system, to which a substrate-attitude control system according to the present invention is applied.
Figure 2:
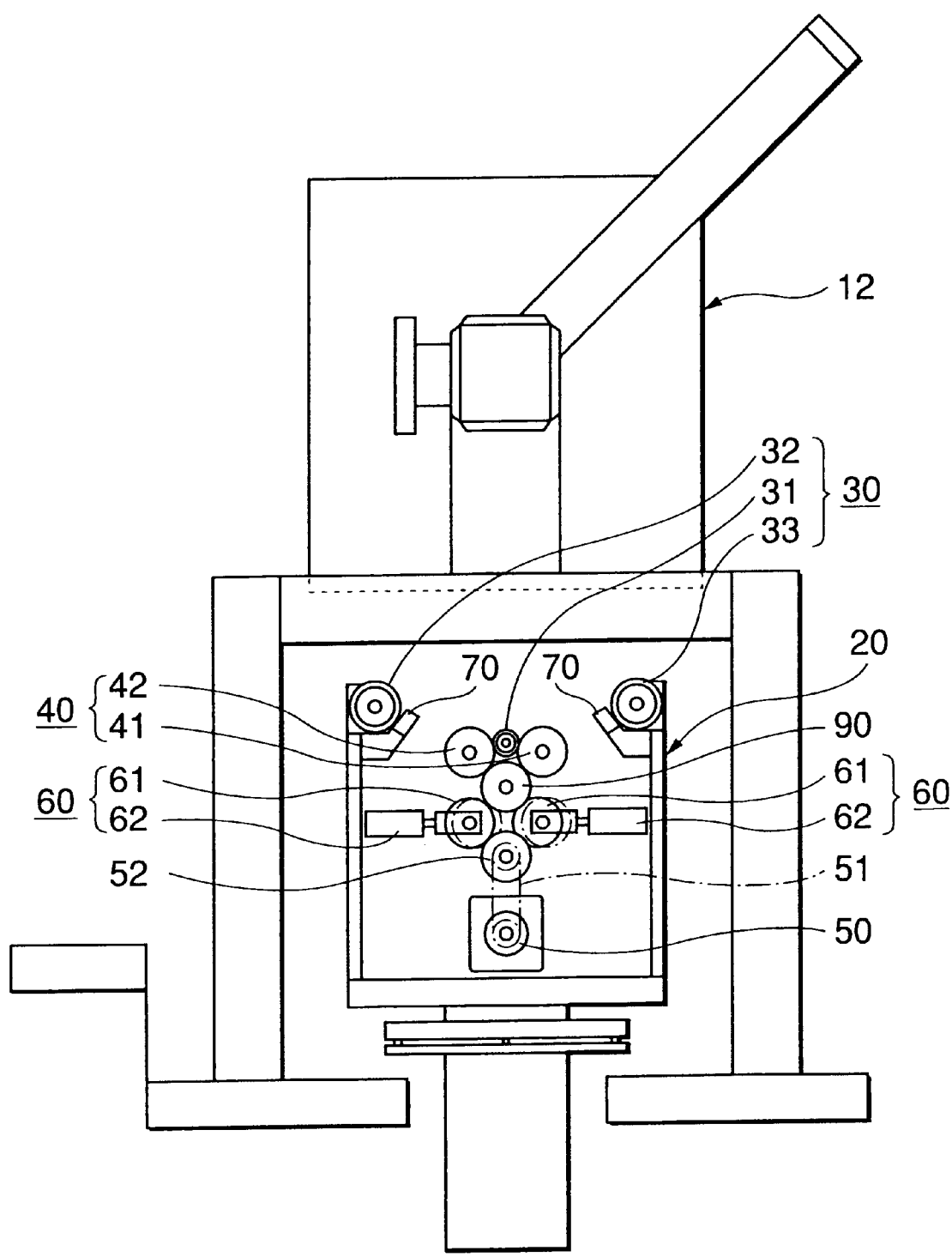
FIG. 2 is a schematic side elevation of a principal part of the cleaning system.
Figure 3:
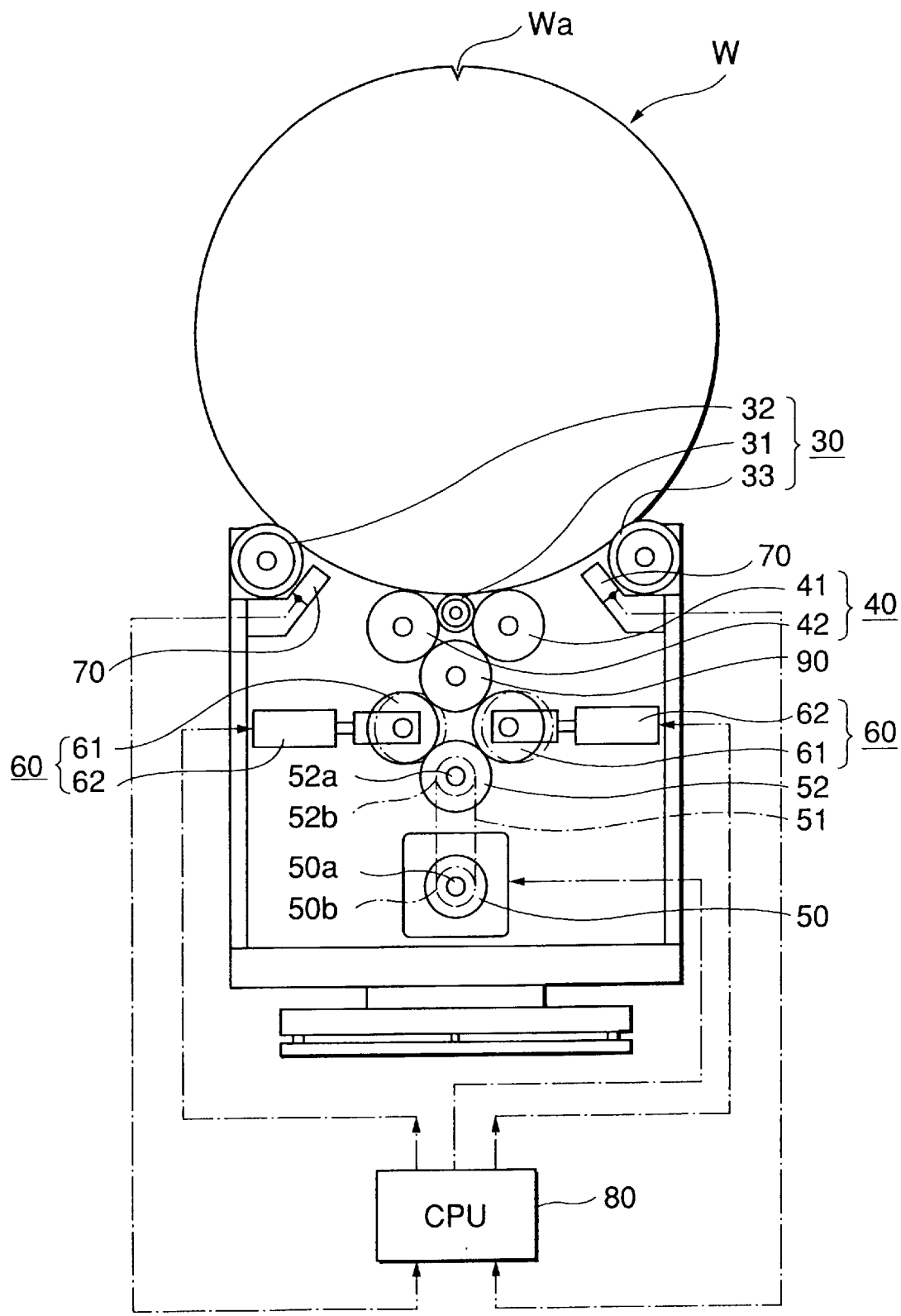
FIG. 3 is a schematic side elevation of a preferred embodiment of a substrate-attitude control system according to the present invention.

FIG. 1 is a schematic plan view showing an example of a cleaning system, to which a substrate-attitude control system according to the present invention is applied, and FIG. 2 is a schematic side elevation of a principal part thereof. FIG. 3 is a schematic side elevation of a substrate-attitude control system.

The cleaning system generally comprises: an introducing/discharging section 2 for introducing and discharging a container, e.g., a carrier 1, for horizontally housing therein semiconductor wafers W (which will be hereinafter referred to as "wafers") which are substrates to be treated; a treatment section 3 for treating the wafers W with a solution, such as a chemical and a cleaning solution, and for drying the wafers W; and a wafer delivery section, e.g., an interface section 4, located between the introducing/discharging section 2 and the treatment section 3, for delivering, positioning, attitude-converting and pitch-adjusting the wafers W.

The introducing/discharging section 2 comprises a carrier introducing part 5a and a carrier discharging part 5b, which are provided on an end portion of one side of the cleaning system, and a wafer introducing/discharging part 6. Between the carrier introducing part 5a and the wafer introducing/discharging part 6, a transport mechanism (not shown) is provided. By this transport mechanism, the carrier 1 is conveyed from the carrier introducing part 5a to the wafer introducing/discharging part 6.

Each of the carrier discharging part 5b and the wafer introducing/discharging part 6 is provided with a carrier lifter (not shown), by which an empty carrier 1 is able to be delivered to and received from a carrier waiting part 7 which is provided above the introducing/discharging part 2. In this case, the carrier waiting part 7 is provided with a carrier transport robot (not shown) movable in horizontal directions (X and Y directions) and vertical directions (Z directions). By this carrier transport robot, empty carriers 1 transported from the wafer introducing/discharging part 6 are designed to be aligned with each other and to be discharged to the carrier introducing/discharging part 5b. In the carrier waiting part 7, not only the empty carriers can wait, but the carrier 1 housing therein the wafers W can wait.

The carrier 1 comprises: a container body 1a, which has an opening on one side thereof and which has holding grooves (not shown) for horizontally holding a plurality of wafers W, e.g., 25 wafers W, at regular intervals; and a lid 1b for opening and closing the opening of the container body 1a. The lid 1b is open and closed by operating an engaging/disengaging mechanism (not shown), which is incorporated in the lid 1b, by means of a lid opening/closing unit 8 which will be described later.

The wafer introducing/discharging part 6 is open to the interface section 4, and the opening thereof is provided with the lid opening/closing unit 8. By this lid opening/closing unit 8, the lid 1b of the carrier 1 is open and closed. Therefore, after the lid 1b of the carrier 1, which has been transported to the wafer introducing/discharging part 6 and which houses therein untreated wafers W, is removed by the lid opening/closing unit 8 to allow the wafers W to be discharged from the carrier 1, and after all of the wafers W are discharged, the lid 1b can be closed again by the lid opening/closing unit 8. In addition, after the lid 1b of an empty carrier 1, which has been transported from the carrier waiting part 7 to the wafer introducing/discharging part 6, is removed by the lid opening/closing unit 8 to allow the wafers W to be introduced into the carrier 1, and after all of the wafers W are introduced, the lid 1b can be closed again by the lid opening/closing unit 8. Furthermore, in the vicinity of the opening of the wafer introducing/discharging part 6, a mapping sensor 9 for detecting the number of the wafers W housed in the carrier 1 is provided.

In the interface section 4, there are provided: a wafer transport arm 10 for holding a plurality of wafers W, e.g., 25 wafers W, in a horizontal state and for delivering the wafers W from and to the carrier 1 of the wafer introducing/discharging part 6 while maintaining the horizontal state; a pitch adjusting means, e.g., a pitch changer (not shown), for holding a plurality of wafers W, e.g., 52 wafers, at regular intervals in a vertical state; an attitude converting unit 12, located between the wafer transport arm 10 and the pitch changer, for converting the attitude of a plurality of wafers W, e.g., 25 wafers W, between the horizontal state and the vertical state; and an attitude control system 20 according to the present invention for detecting notches Wa, each of which is formed in each of the wafers W attitude-converted to the vertical state, to position the wafers W. The interface section 4 is also provided with a transport channel 13 communicated with the treatment section 3. The transport channel 13 is movably provided with a wafer (substrate) transport means, e.g., a wafer transport chuck 14.

The wafer transport arm 10 comprises two holding parts, e.g., arm bodies 10a, 10b, for taking the plurality of wafers W out of the carrier 1 in the wafer introducing/discharging part 6 to transport the wafers W and for introducing the wafers W into the carrier 1. These arm bodies 10a, 10b are mounted on the upper portion of a driving table 11, which is movable in horizontal directions (X, Y directions) and vertical directions (Z directions) and rotatable (Θ directions), for independently holding the wafers W in a horizontal state and for delivering the wafers W between the carrier 1, which is mounted in the wafer introducing/ discharging part 6, and the attitude converting unit 12. Therefore, one 10a of the arm bodies is able to hold untreated wafers W, and the other arm body 10b is able to hold treated wafers W.

On the other hand, in the treatment part 3, there are provided: a first treatment unit 15 for removing particles and organic contamination substances which adhere to the wafers W; a second treatment unit 16 for removing metal contamination substances which adhere to the wafers W; a cleaning/drying unit 17 for removing chemical oxide films which adhere to the wafers W and for drying the wafers W; and a chuck cleaning unit 18. These units 15 through 18 are in alignment with each other. In the transport channel 13 arranged so as to face the respective units 15 through 18, there is provided the wafer transport chuck 14 (wafer transport means) which is movable in X and Y directions (horizontal directions) and Z directions (vertical directions) and rotatable (Θ). Furthermore, it is not always required to arrange the chuck cleaning unit 18 between the cleaning/ drying unit 17 and the interface section 4. For example, the chuck cleaning unit 18 may be arranged between the second treatment unit 16 and the cleaning/drying unit 17. Alternatively, the chuck cleaning unit 18 may be arranged in the vicinity of the first treatment unit 15.

The attitude control system according to the present invention will be described below. As shown in FIGS. 2 and 3, the attitude control system 20 generally comprises: a holding means 30 for rotatably holding the wafers W; a rotation transmitting means 40 for contacting the peripheral portions of the wafers W to rotate the wafers W; a rotation driving source 50 for rotating the wafers W; a transmission switching means 60 for selectively transmitting power from the rotation driving source 50 to the rotation transmitting means 40; a detecting means 70 for detecting the notches Wa, which are positioning notches formed in the peripheral portions of the wafers W; and a control means 80 for controlling the operations of the rotation driving source 50 and the transmission switching means 60 on the basis of detection signals outputted from the detecting means 70.

The holding means 30 comprises a lower holding rod 31 for holding the lower end portions of the vertically arranged wafers W, and two side holding rods 32, 33 for holding the both lower sides of the wafers W. In the lower holding rod 31 and the side holding rods 32 and 33, holding grooves 31a, 32a and 33a for holding the wafers W are formed at regular intervals, respectively (see FIG. 4). Each of the holding grooves of one of the side holding rods 32 and 33, e.g., each of the holding grooves 32a of the side holding rod 32 arranged on the left side in FIG. 3, has a substantially V-shaped cross section for supporting the weight of a corresponding one of the wafers W (see FIG. 5(a)). Each of the holding grooves 33a of the other side holding rods 33, which do not support thereon the weight of a corresponding one of the wafers W, and the holding grooves 31a of the lower holding rod 31 has a substantially Y-shaped cross section for preventing the inclination of the corresponding one of the wafers W in directions perpendicular to the plane thereof (see FIGS. 5(b) and 5(c)). Thus, if each of the holding grooves 32a of the side holding rod 32 for supporting the weight of each of the wafers W has the substantially V-shaped cross section, and if each of the holding grooves 33a of the side holding rod 33, which do not support thereon the weight of the corresponding one of the wafers W, and the holding grooves 31a of the lower holding rod 31 has the substantially Y-shaped cross section, it is possible to decrease the areas of the wafers W contacting the holding rods 31, 32 and 33, and it is possible to stably hold the wafers W at regular intervals.

Figure 4:
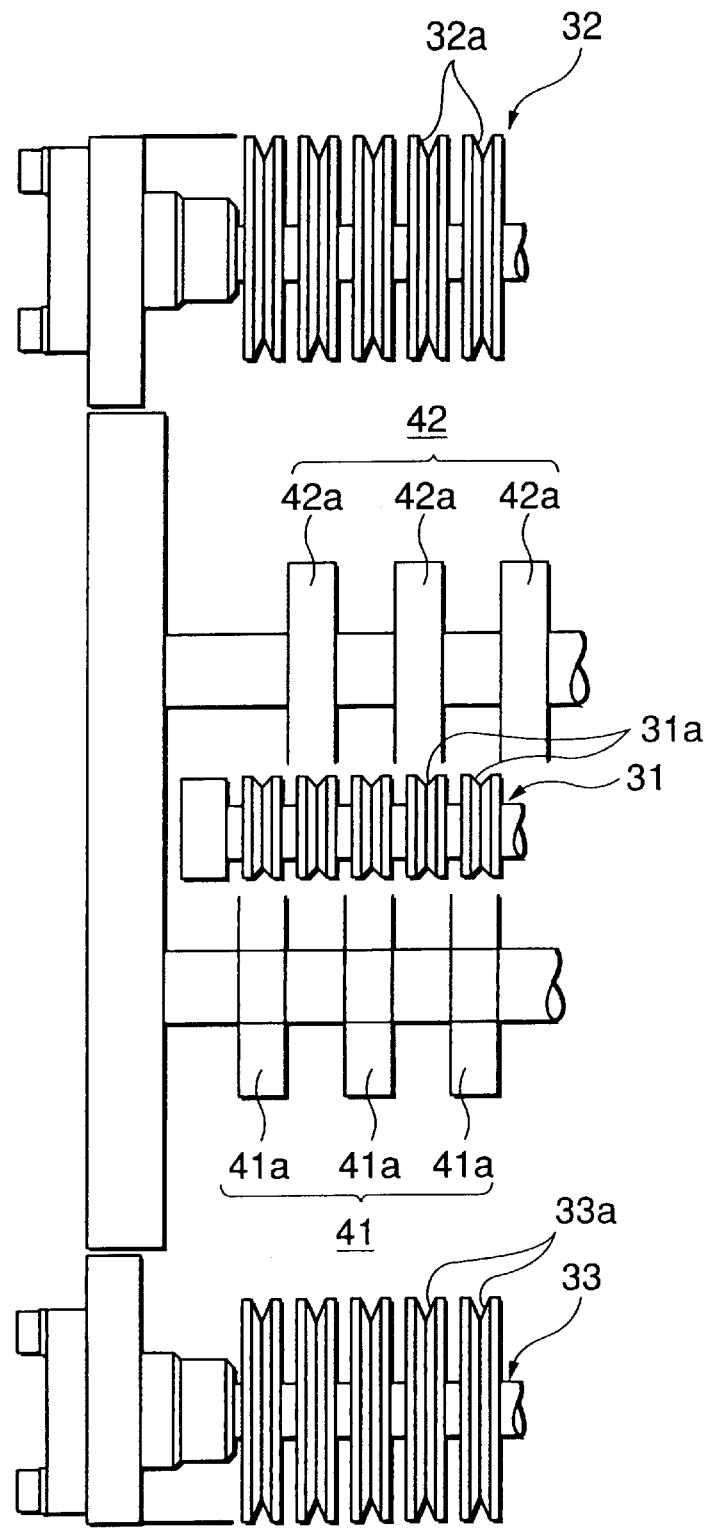
FIG. 4 is a plan view of a principal part of a lower holding rod, a side holding rod and a transmission roller according to the present invention.
Figure 5:
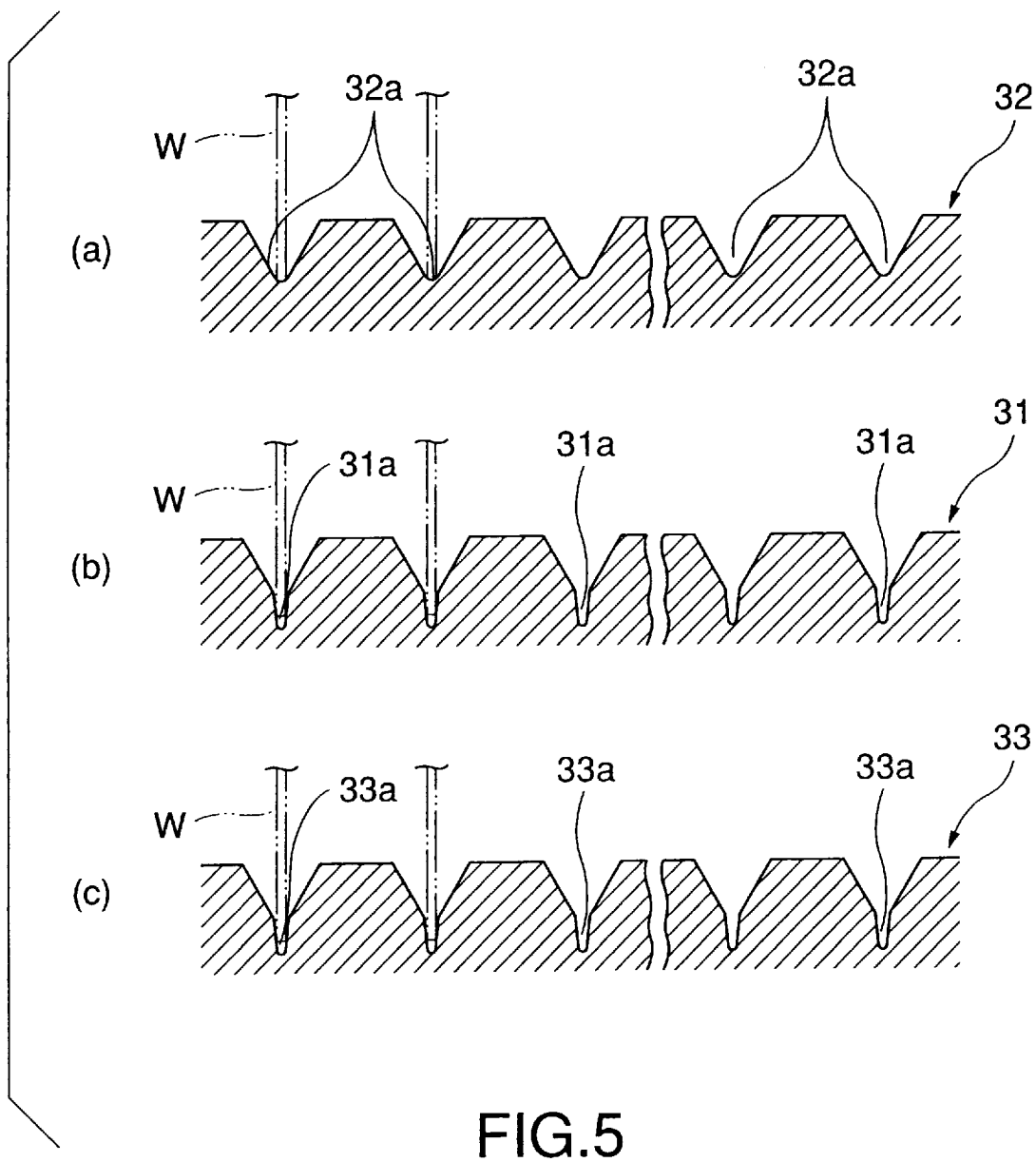
FIG. 5 is enlarged sectional views showing the shapes of the holding grooves of the lower holding rod and the side holding rod.

As shown in FIGS. 3 and 4, the rotation transmitting means 40 comprises first and second rotation transmitting roller groups 41 and 42 arranged on both sides of the lower holding rod 31 between the both side holding rods 32 and 33. The first rotation transmitting roller group 41 (on the right side in FIG. 3) comprises a plurality of transmission rollers, e.g., 13 transmission rollers 41a, for transmitting the rotation of the wafers W in odd rows, and the second rotation transmitting roller group 42 (on the left side in FIG. 3) comprises a plurality of transmission rollers, e.g., 12 transmission rollers 42a, for transmitting the rotation of the wafers W in even rows (see FIG. 4).

While the wafers W are held by the three holding rods 31, 32 and 33 and the two rotation transmitting roller groups 41 and 42, the wafers W may be held by at least one side holding rod 32 for supporting the wafers W, and the rotation transmitting roller groups 41 and 42.

On the other hand, the rotation transmitting means 40, i.e., the transmission rollers 41a and 42a of the first and second rotation transmitting roller groups 41 and 42, selectively contact the transmission switching means 60 via a plurality of intermediate rollers 90 contacting the transmission rollers 41a and 42a.

Figure 6:
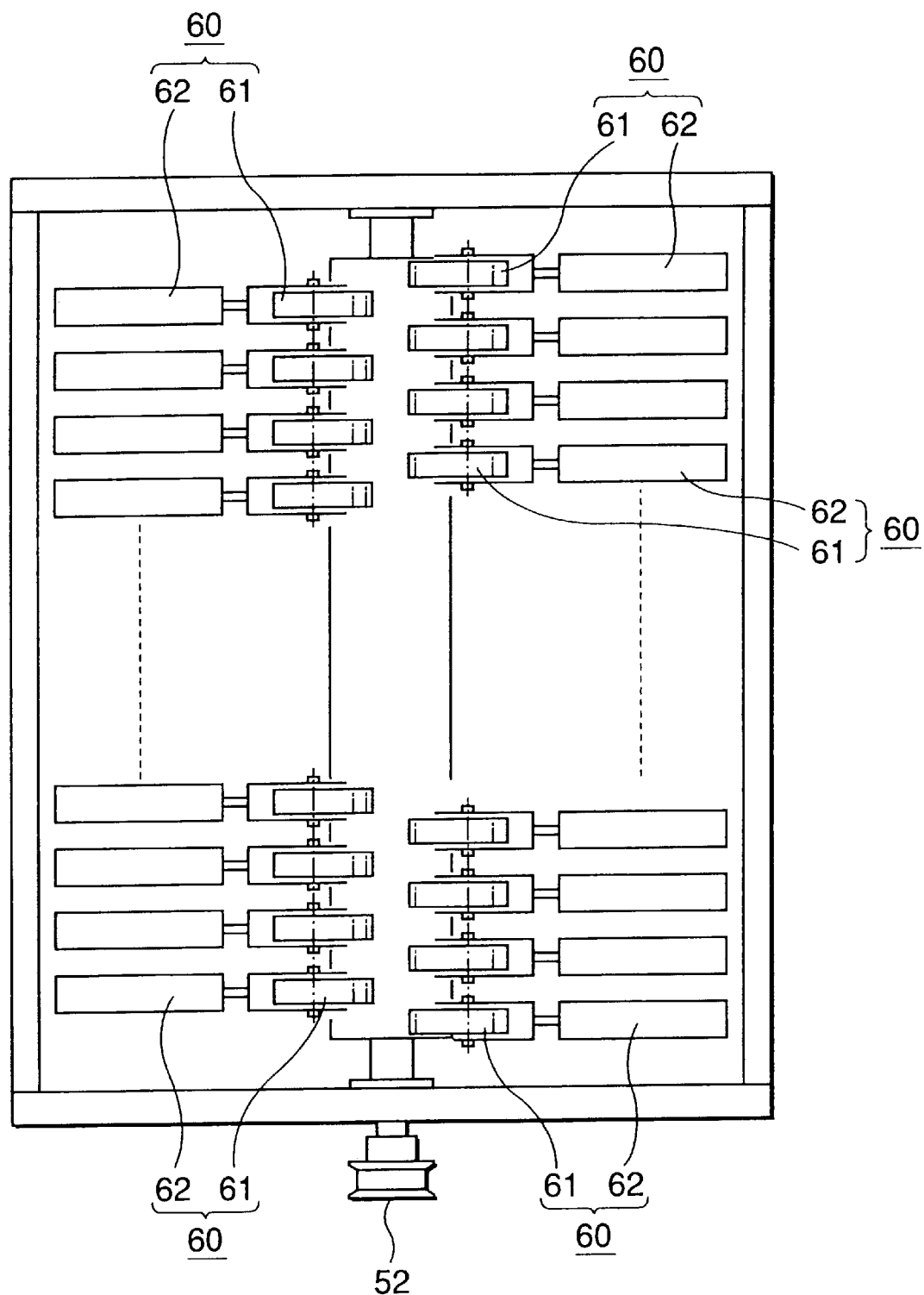
FIG. 6 is a schematic plan view showing the arrangement of a transmission switching means according to the present invention.
Figure 7:
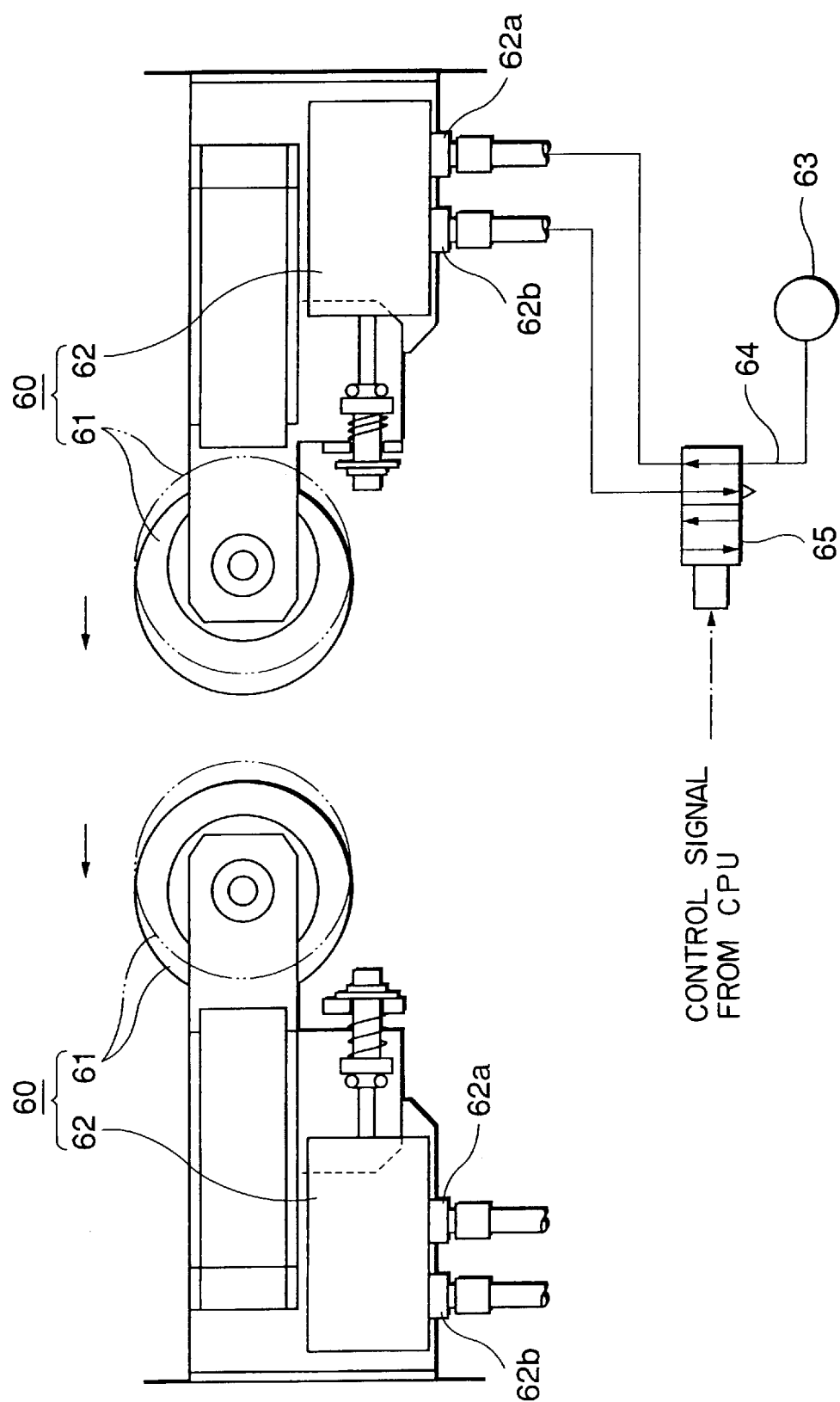
FIG. 7 is a side elevation of the transmission switching means.

As shown in FIGS. 3, 6 and 7, the transmission switching means 60 comprises: switching rollers 61 for selectively contacting the transmission rollers 41a and 42a of the rotation transmitting means 40 and a drive transmitting means, e.g., a drive transmitting roller 52, which is driven by the rotation driving source 50 via a funis, e.g., a timing belt 51; and moving mechanisms, e.g., air cylinders 62, for switching, i.e., moving, the positions of the switching rollers 61 between a contact position, at which the switching rollers 61 contact the transmission rollers 41a and 42a and the drive transmitting roller 52, and a non-contact position.

The rotation driving source 50 comprises a stepping motor which rotates at a predetermined angle of rotation on the basis of pulse signals, for example. The power from the stepping motor 50 is transmitted to the drive transmitting roller 52 by means of the timing belt 51 wound onto a driving pulley 50b, which is mounted on a driving shaft 50a of the stepping motor 50, and a driven pulley 52b mounted on a rotation shaft 52a of the drive transmitting roller 52.

The detecting means 70 comprises a transmission photo sensor provided between and in the vicinity of the side holding groups 32 and 33 on both sides. By this photo sensor 70, the notches Wa of the rotating wafers W are detected to transmit a detection signal to a control means, e.g., a central processing unit (which will be hereinafter referred to as a "CPU") 80, by which the detection signal is compared with information stored in the CPU 80 to transmit a control signal to the stepping motor 50 and the air cylinder 62 of the transmission switching means 60. The control signal transmitted from the CPU 80 to the air cylinder 62 switches a four-port-2-position electromagnetic selector valve 65, which is provided in an air supply pipe 64 for establishing the communication between primary and secondary ports 62a, 62b, which are provided in the air cylinder 62, and an air supply source 63 to move the switching roller 61 between the contact position, at which the transmission rollers 41a, 42a contact the drive transmitting roller 52, and the non-contact position.

The attitude control system according to the present invention is movable below the attitude converting unit 12 by means of a horizontally moving mechanism (not shown), and movable vertically with respect to the attitude converting unit 12 by means of a lifter mechanism (not shown).

Referring to FIGS. 8 and 9, the operation of the attitude control system will be described below.

First, when a carrier 1 housing therein untreated wafers W is mounted in the carrier introducing part 5a by an operator or a transport robot, a transport mechanism (not shown) moves to introduce the carrier 1 into the wafer introducing/discharging part 6. The carrier 1 introduced into the wafer introducing/discharging part 6 waits for the interface section 4 while the lid 1b is open by the lid opening/closing unit 8. At this time, the mapping sensor 9 operates to detect the number of the wafers W housed in the carrier 1.

After the number of the wafers W in the carrier 1 is detected by the mapping sensor 9, the wafer transport arm 10 (specifically, the arm body 10a) provided in the interface section 4 enters the carrier 1 to take out a plurality of wafers W, e.g., 25 wafers W, which are housed in the carrier 1, to transport the wafers W to the attitude converting unit 12. The wafers W transported to the attitude converting unit 12 are attitude-converted from the horizontal state to the vertical state. Then, after the attitude control system 20 moves below the attitude converting unit 12, the attitude control system 20 moves upwards to hold the wafers W, which are held by the attitude converting unit 12, in the lower holding rod 31 and the both side holding rods 32, 33 to receive the wafers W. Thereafter, the attitude control system 20 moves downwards to carry out the positioning of the wafers W as follows.

Figure 8A:
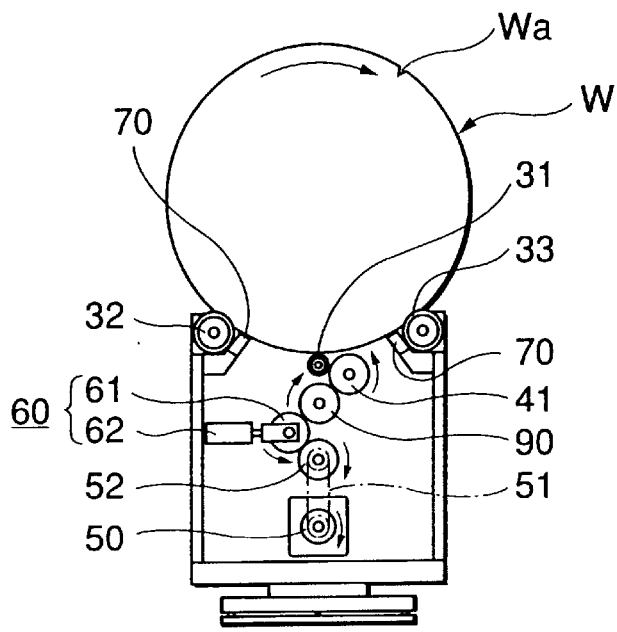
FIGS. 8A through 8C are schematic side elevations showing an example of the operation of a substrate-attitude control system according to the present invention, which show positioning states of a wafer in an odd row.
Figure 8B:
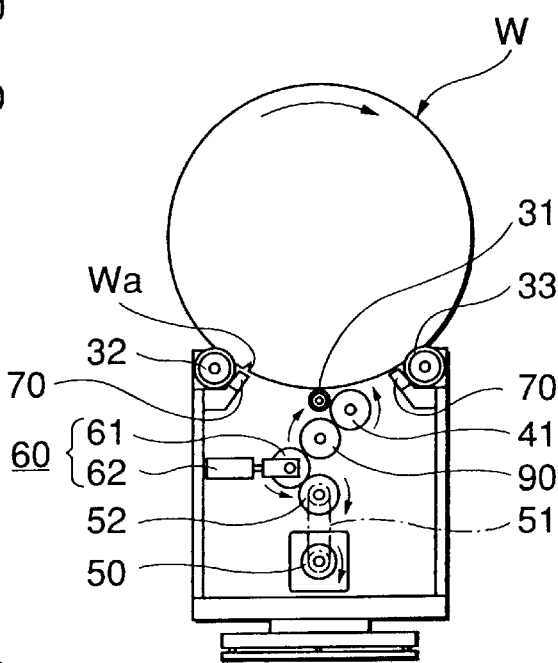
Figure 8C:
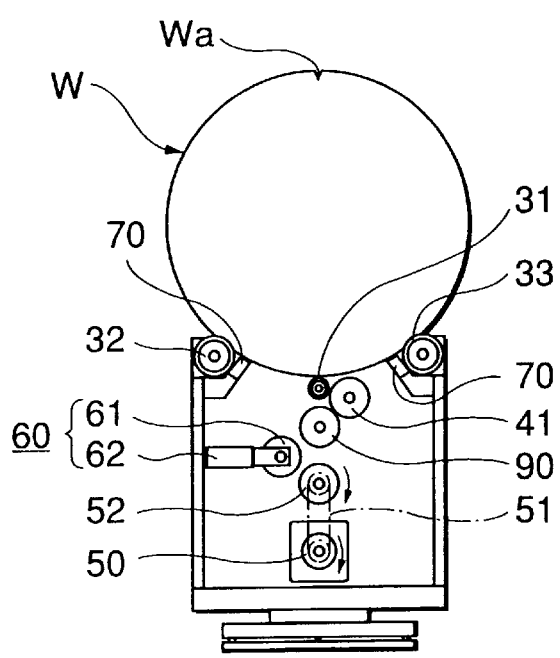

First, if 13 wafers W in odd rows are rotated clockwise as shown in FIG. 8A, and if the notches Wa are detected by the photo sensor 70 as shown in FIG. 8B, a detection signal is transmitted from the photo sensor 70 to the CPU 80, and a control signal is transmitted from the CPU 80 to the stepping motor 50 to transmit pluses until the notches Wa move to a predetermined position, e.g., to the top. Thereafter, the air cylinder 62 of the transmission switching means 60 is operated to move the switching roller 61 backwards, i.e., to switch the position of the switching roller 61 to the non-contact position, at which the transmission rollers 41a, 42a do not contact the drive transmitting roller 52, to move the notches Wa to the top (see FIG. 8C. Thus, the notches Wa of the wafers W in the odd rows are moved to the top to finish the positioning of the wafers W in the odd rows.

Figure 9A:
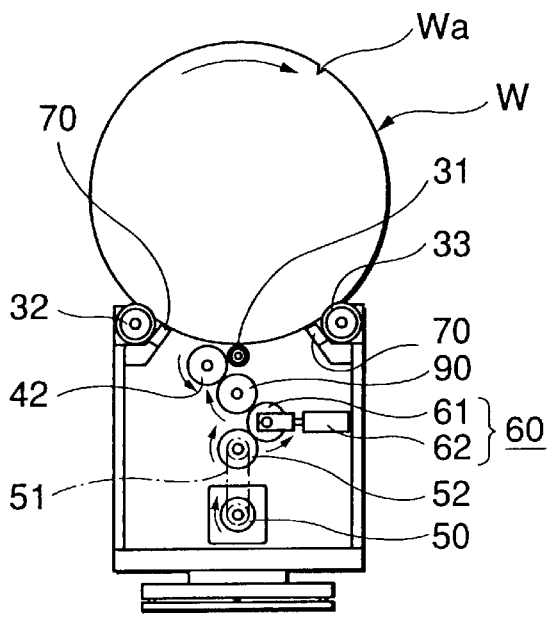
FIGS. 9A through 9C are schematic side elevations showing an example of the operation of a substrate-attitude control system according to the present invention, which show positioning states of a wafer in an even row.
Figure 9B:
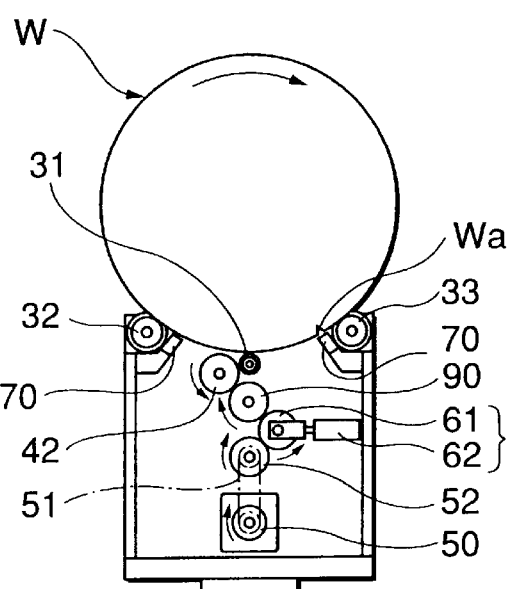
Figure 9C:
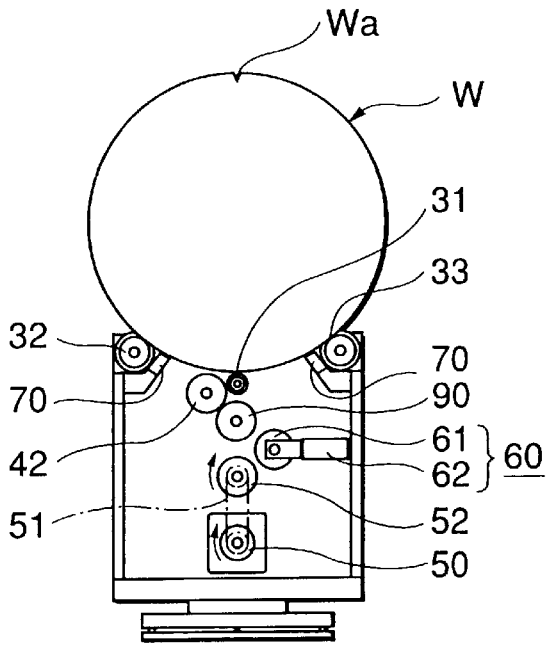

Then, the positioning of the wafers W in even rows is carried out in the same manner as that of the wafers W in the odd rows. That is, if the wafers W are rotated clockwise as shown in FIG. 9A and if the notches Wa are detected by the photo sensor 70 as shown in FIG. 9B, a detection signal is transmitted from the photo sensor 70 to the CPU 80, and a control signal is transmitted from the CPU 80 to the stepping motor 50 to transmit pluses until the notches Wa move to a predetermined position, e.g., to the top, i.e., to drive the stepping motor 50 by a predetermined number of pulses to rotate the wafers W to a predetermined position, e.g., to the top. Thereafter, the air cylinder 62 of the transmission switching means 60 is operated to move the switching roller 61 backwards, i.e., to switch the position of the switching roller 61 to the non-contact position, at which the transmission rollers 41a, 42a do not contact the drive transmitting roller 52, to move the notches Wa to the top (see FIG. 9C). Furthermore, after the notches Wa of the final wafer W is detected to transmit a predetermined number of pulses to the stepping motor 50, the stepping motor 50 may be stopped without moving the switching roller 61 of the transmission switching means 60 backwards. Thus, the notches Wa of the wafers W in the even rows are moved to the top to finish the positioning of the wafers W in the even rows, and to finish the positioning of all of the wafers W. Furthermore, while the positioning of the wafers W in the odd rows and the positioning of the wafer W in the even rows have been separately carried out, the wafers W in the odd and even rows may be simultaneously rotated to carry out the positioning thereof. Alternatively, after the notches Wa are aligned once at the lower portions, the wafers W may be rotated again to suitably align the upper portions.

After the wafers W thus positioned are delivered to the attitude converting unit 12 again, the wafers W are received by the pitch changer (not shown) to adjust the pitches between the wafers W. Then, the wafers W are delivered from the pitch changer to the wafer transport chuck 14 to be transported into the treatment section 3, in which the wafers W are suitably cleaned.

After the cleaned wafers W are delivered from the wafer transport chuck 14 to the pitch changer, the wafers W are attitude-converted from the vertical state to the horizontal state by means of the attitude converting unit 12. In this state, the other wafer transport arm 10, i.e., the arm body 10b other than the arm body 10a, which holds untreated wafers W, moves toward the attitude converting unit 12 to receive the wafers W.

After the wafer transport arm 10 receives the wafers W, the wafer transport arm 10 moves to the wafer delivery part 6 to introduce the wafers W into an empty carrier 1 waiting in the wafer introducing/discharging part 6. Thereafter, the lid 1c of the carrier 1 is closed by the lid opening/closing unit 8, and the wafer carrier 1 is transported from the wafer introducing/discharging part 6 to the carrier discharging part 5b.

Figure 10:
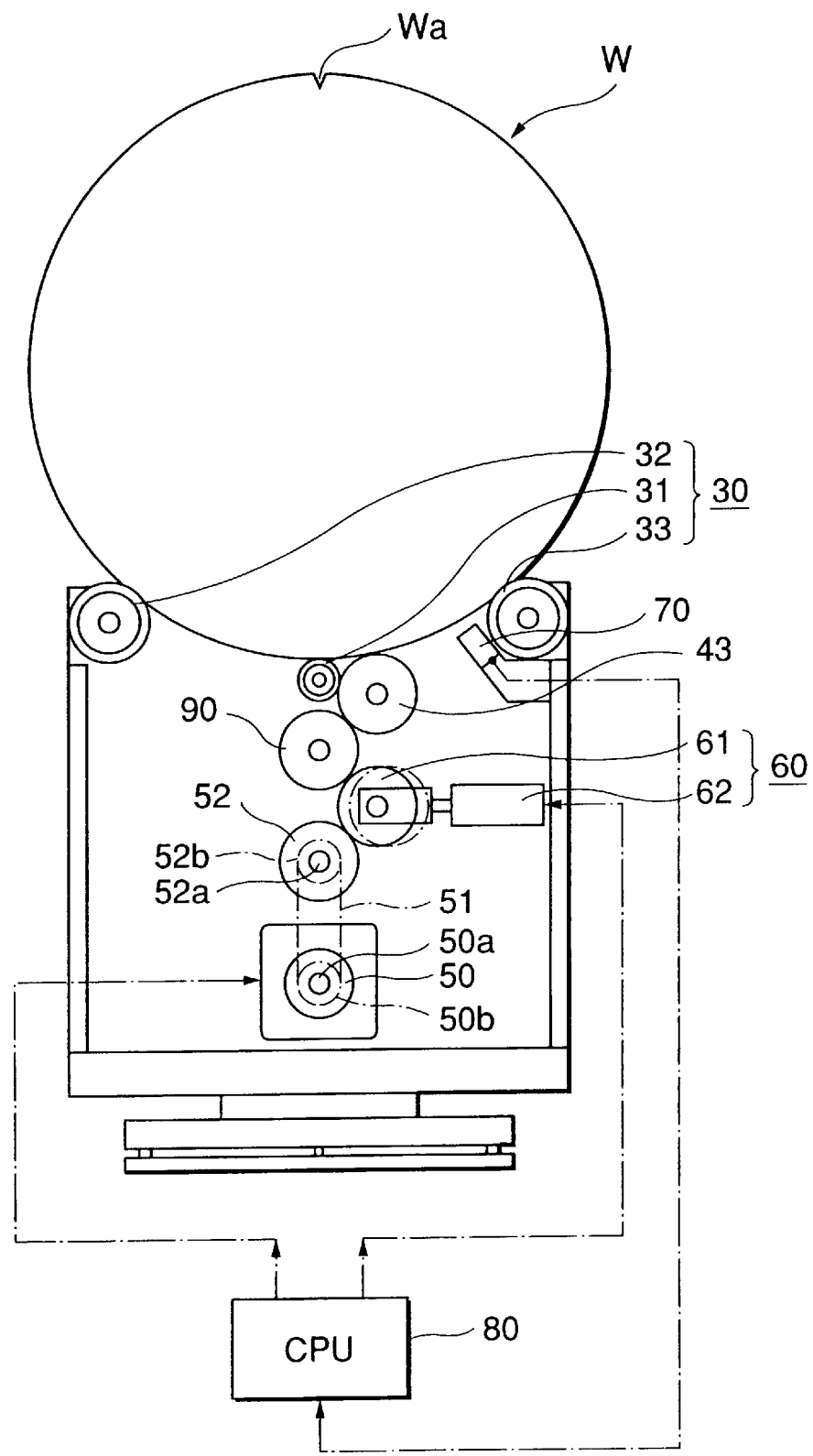
FIG. 10 is a schematic side elevation of another preferred embodiment of a substrate-attitude control system according to the present invention.

In the above described preferred embodiment, while the plurality of wafers W, e.g., 25 wafers W, in the odd and even rows have been separately positioned, but it is not always required to separately position the wafers W in the odd and even rows. As shown in FIG. 10, the respective wafers W may be held by transmission rollers (not shown) of a single transmission roller group 43, and the wafers W in the odd and even rows may be simultaneously positioned. Furthermore, in FIG. 10, other constructions are the same as those in the above described preferred embodiment, so that the same reference numbers are used for the same portions and the descriptions thereof are omitted.

Figure 11:
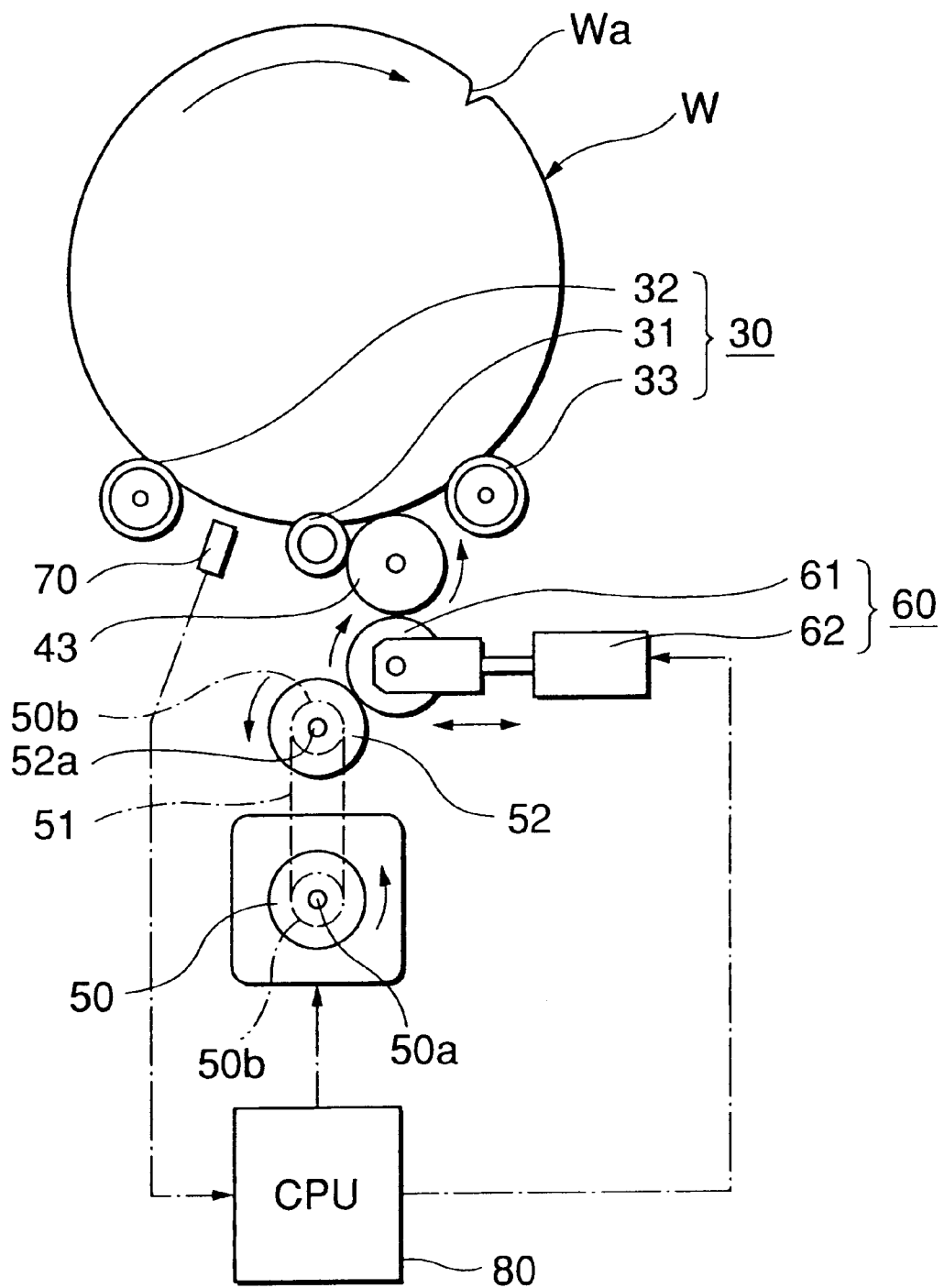
FIG. 11 is a schematic side elevation of a further preferred embodiment of a substrate-attitude control system according to the present invention.
Figure 12:
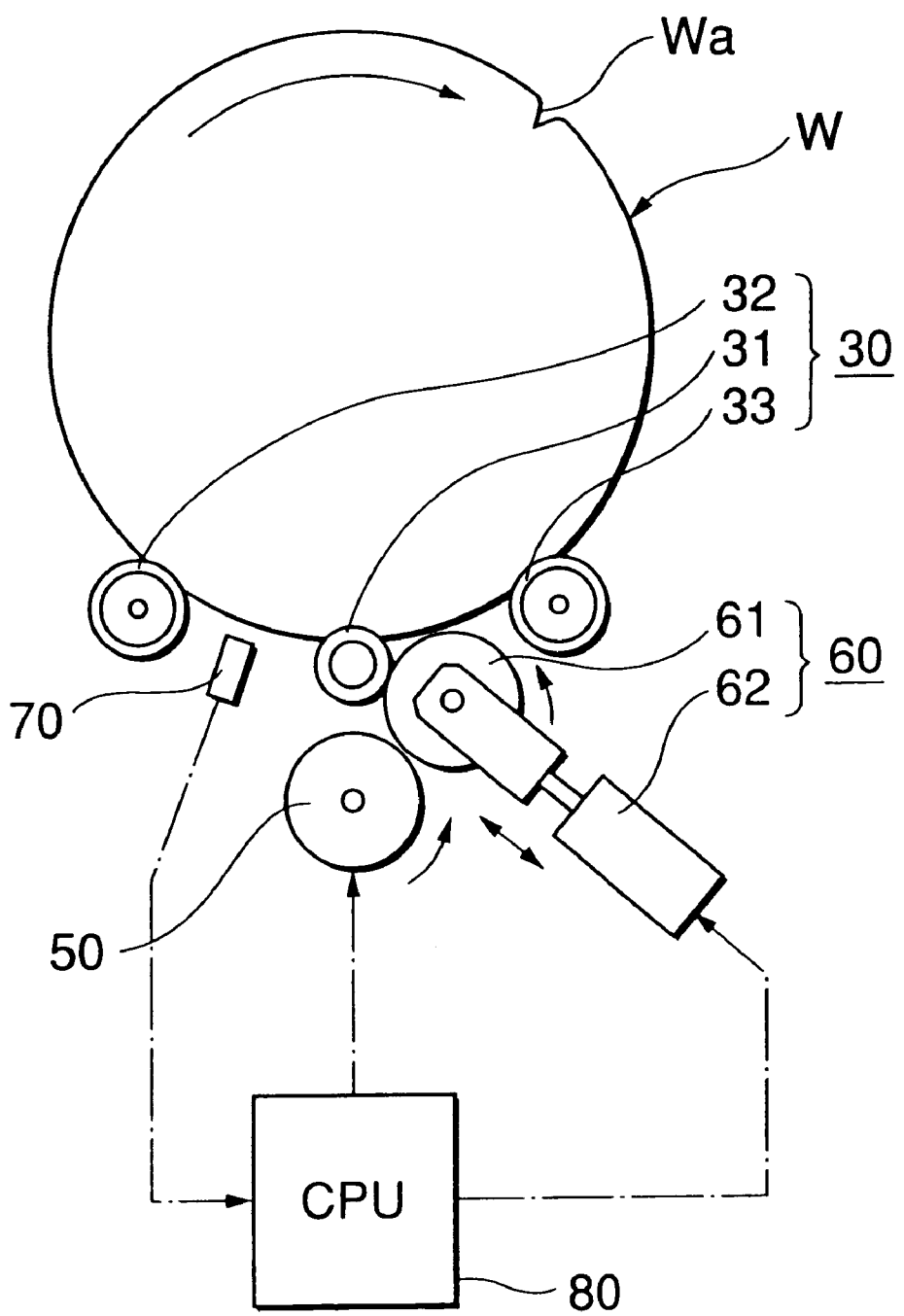
FIG. 12 is a schematic side elevation of a still further preferred embodiment of a substrate-attitude control system according to the present invention.
Figure 13:
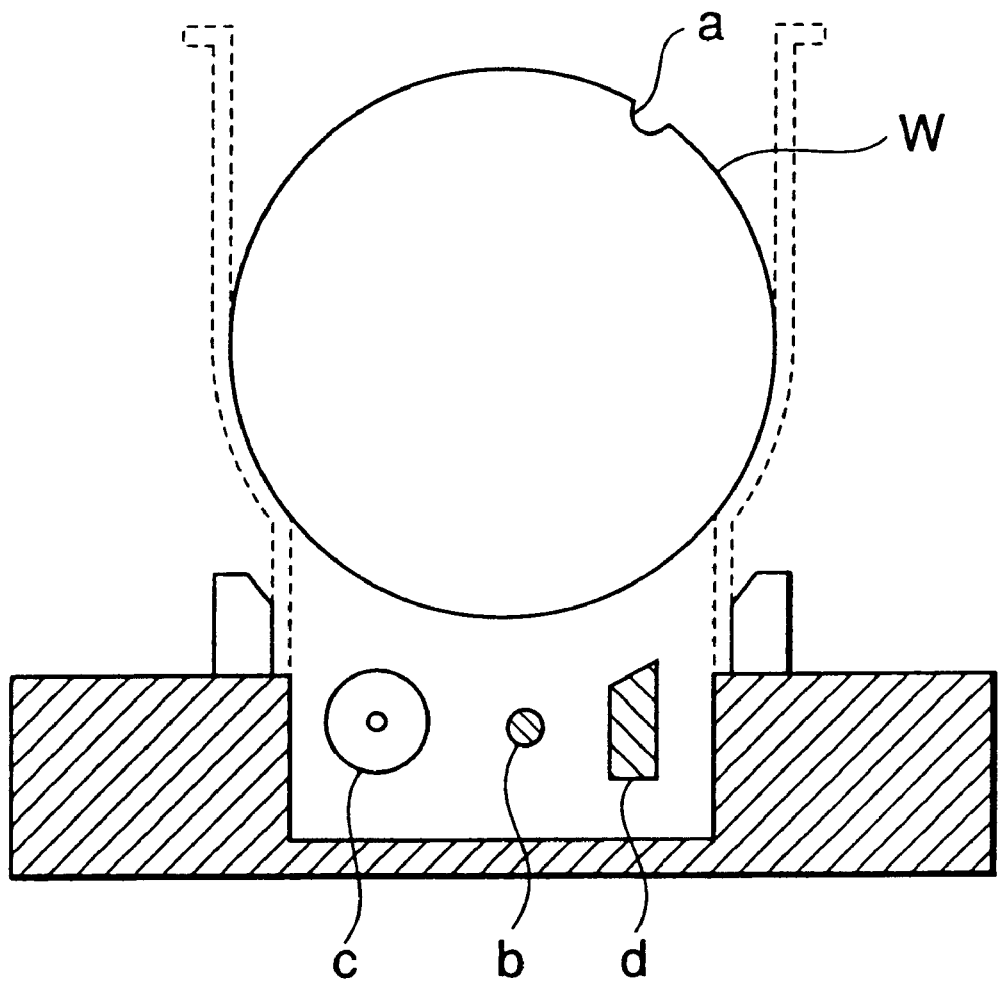
FIG. 13 is a schematic side elevation of a conventional substrate-attitude control system.

In the preferred embodiment shown in FIG. 10, while the intermediate rollers 90 have been provided between the transmission rollers 43 of the rotation transmitting means 40 and the switching rollers 61 of the transmission switching means 60, the intermediate rollers 90 may be omitted to cause the transmission rollers 43 to selectively contact the switching rollers 61 as shown in FIG. 11. Alternatively, as shown in FIG. 12, the rotation transmitting means 40 may be integral with the transmission switching means 60. That is, the switching rollers 61 of the transmission switching means 60 may be provided between the drive transmitting rollers 52 on the side of the rotation driving source 50 (stepping motor) and the wafers W so as to be able to contact the wafers W. In this case, since it is required to hold the wafers W when the switching rollers 61 are positioned at the non-contact positions, the holding grooves of one of the other side holding rod 33 and the lower holding rod 31 must be formed so as to have a V-shaped cross section to be associated with the one side holding rod 32 to hold the wafers W.

In the above described preferred embodiment, while the rotation driving source 50 (stepping motor) has been connected to the drive transmitting means, e.g., the drive transmitting roller 52, via the funis, e.g., the timing belt 51, the drive transmitting roller 52 may be mounted directly on the driving shaft 50*a* of the stepping motor 50 as shown in FIG. 12.

While the above described preferred embodiment of a substrate-attitude control system according to the present invention has been applied to the cleaning system for semiconductor wafers, it may be applied to a treatment system other than the cleaning system. In addition, the substrate-attitude control system may be applied to disk-shaped substrates, such as photo-magnetic disks, compact disks and minidisks, other than semiconductor wafers.

As described above, according to the present invention, the rotation transmitting means is driven by the rotation driving source to rotate the substrates, which are held by the holding means, in circumferential directions, and the positioning notches formed in the substrates are detected by the detecting means to produce detection signals. On the basis of the detection signals, the rotation driving source is rotated by a predetermined angle. Thereafter, the drive transmission performed by the transmission switching means is stopped, or the rotation driving source is stopped. Therefore, it is possible to surely align the positioning notches of the substrates at the predetermined positions. In addition, the rotation driving source is arranged at a position apart from the substrates, and the drive transmission performed by the transmission switching means is stopped, or the rotation of the drive transmitting means is stopped, to position the substrate. Therefore, it is possible to inhibit dust from being produced, and it is possible to decrease the wear of the rotation driving source.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A substrate-attitude control system comprising:
   holding means for holding a plurality of disk-shaped substrates so that the substrates are rotatable in circumferential directions;
   rotation transmitting means for contacting a peripheral portion of each of said substrates to rotate said substrates;
   a rotation driving source for rotating said substrates;
   transmission switching means for selectively transmitting a power from said rotation driving source to said rotation transmitting means so as to be capable of switching transmission/non-transmission;
   detecting means for detecting a positioning notch formed in the peripheral portion of each of said substrates; and
   control means for controlling the operation of said transmission switching means on the basis of a detection signal outputted from said detecting means.

2. A substrate-attitude control system as set forth in claim 1, wherein said control means is capable of controlling the operation of said rotation driving source.

3. A substrate-attitude control system as set forth in claim 1, wherein said rotation transmitting means is integral with said transmission switching means.

4. A substrate-attitude control system as set forth in claim 1, wherein said holding means comprises one or a plurality of holding rods having holding grooves for holding said substrates so that said substrates are able to be supported in said holding grooves of at least one of said holding rods.

5. A substrate-attitude control system as set forth in claim 1, wherein said holding means comprises one or a plurality of holding rods, each of which has a plurality of holding grooves for holding said substrates at regular intervals so that said substrates are able to be supported in said holding grooves of at least one of said holding rods;
   said rotation transmitting means comprises a first rotation transmitting roller group comprising a plurality of transmission rollers for independently transmitting rotation to said substrates in odd rows, and a second rotation transmitting roller group comprising a plurality of transmission rollers for independently transmitting rotation to said substrate in even rows;
   said transmission switching means comprises switching rollers, each of which is capable of selectively contacting a corresponding one of said transmission rollers of said first and second rotation transmitting roller groups, and a moving mechanism for moving said switching rollers so that each of said switching rollers contacts or leaves said corresponding one of said transmission rollers; and
   said detecting means comprises a plurality of sensors for detecting said positioning notch formed in the peripheral portion of each of said substrates.

6. A substrate-attitude control system as set forth in claim 5, which further comprises an intermediate roller, provided between said first and second rotation transmitting roller groups and said switching rollers of said transmission switching means, for contacting said transmission rollers of said first and second rotation transmitting roller groups and said switching rollers.

7. A substrate-attitude control system as set forth in claim 1, wherein said holding means comprises one or a plurality of holding rods, each of which has a plurality of holding grooves for holding said substrates at regular intervals so that said substrates are able to be supported in said holding grooves of at least one of said holding rods;
   said rotation transmitting means comprises a rotation transmitting roller group comprising a plurality of transmission rollers for independently transmitting rotation to said substrates;
   said transmission switching means comprises switching rollers, each of which selectively contacts a corresponding one of said transmission rollers of said rotation transmitting roller groups so as to be able to switch transmission/non-transmission, and a moving mechanism for moving said switching rollers so that each of said switching rollers contacts or leaves said corresponding one of said transmission rollers; and
   said detecting means comprises a plurality of sensors for detecting said positioning notch formed in the peripheral portion of each of said substrates.

8. A substrate-attitude control system as set forth in claim 7, which further comprises an intermediate roller, provided between said rotation transmitting roller group and said switching rollers of said transmission switching means, for contacting said transmission rollers of said rotation transmitting roller group and said switching rollers.

9. A substrate-attitude control system as set forth in claim 1, wherein said holding means comprises a plurality of holding rods, at least one of which has holding grooves for supporting thereon said substrates, each of said holding grooves of said at least one of said holding rods having a substantially V-shaped cross section, and each of the other holding rods having holding grooves, each of which has a substantially Y-shaped cross section.

10. A substrate-attitude control system as set forth in claim 1, which further comprises drive transmitting means which is provided between said rotation driving source and said transmission switching means and which is driven by said rotation driving source via a timing belt.

11. A substrate-attitude control system as set forth in claim 1, wherein said rotation driving source comprises a stepping motor.

12. A substrate-attitude control method comprising the steps of:
rotating a rotation transmitting roller via a transmission switching roller driven by a rotation driving source;
rotating a disk-shaped substrate in circumferential direction by contacting a peripheral portion of the substrate to the rotation transmitting roller;
detecting a positioning notch formed in the peripheral portion of said substrate; and
separating the transmission switching roller from the rotation transmitting roller to stop rotation of said substrate on the basis of a signal outputted by said detection.

13. A substrate-attitude control method as set forth in claim 12, wherein after said positioning notch of said substrate is detected, a predetermined number of pulses are transmitted to a rotation driving source to rotate said substrate by an angle corresponding to said predetermined number of pulses, and thereafter, said transmission switching roller is switched to stop rotation of said substrate.

14. A substrate-attitude control method as set forth in claim 12, wherein after rotation of said substrate is stopped on the basis of a detection signal, said substrate is rotated again and rotated by a predetermined angle, and thereafter, said transmission switching roller is switched to stop rotation of said substrate or to stop said rotation driving source.

15. A substrate-attitude control method as set forth in claim 12, wherein after rotation of said substrate is stopped on the basis of a detection signal, said substrate is rotated again, and a predetermined number of pulses are transmitted to said rotation driving source to rotate said substrate by an angle corresponding to said predetermined number of pulses, and thereafter, said transmission switching roller is switched to stop rotation of said substrate or to stop said rotation driving source.

16. A substrate-attitude control method comprising the steps of:
rotating a plurality of rotation transmitting rollers via a plurality of transmission switching rollers driven by a rotation driving source;
rotating a plurality of disk-shaped substrates in circumferential directions by contacting a peripheral portion of each of the substrates to each of the rotation transmitting rollers;
detecting a positioning notch formed in a peripheral portion of each of said substrates; and
separating each of the transmission switching rollers from each of the rotation transmitting rollers to stop rotation of each of said substrates on the basis of a signal outputted by said detection,
wherein rotation of a final substrate of said substrates is stopped by the transmission switching roller or by stopping said rotation driving source.

17. A substrate-attitude control method as set forth in claim 16, wherein after said positioning notch of each of said substrates is detected, said rotation driving source is driven by a predetermined number of pulses to rotate each of said substrates to a predetermine position, and thereafter, said transmission switching rollers are switched to stop rotation of each of said substrates.

18. A substrate-attitude control method as set forth in claim 16, wherein after rotation of all of said substrates is stopped on the basis of a detection signal, all of said substrates are rotated again, and a predetermined number of pulses are transmitted to said rotation driving source to switch said transmission switching rollers to stop rotation of all of said substrates or to stop said rotation driving source.

19. A substrate-attitude control system comprising:
holding member for holding a plurality of disk-shaped substrates so that the substrates are rotatable in circumferential directions;
rotation transmitting rollers for contacting a peripheral portion of each of said substrates to rotate said substrates;
a rotation driving source for rotating said substrates;
transmission switching rollers for selectively transmitting a power from said rotation driving source to said rotation transmitting rollers so as to be capable of switching transmission/non-transmission;
detector for detecting a positioning notch formed in the peripheral portion of each of said substrates; and
controller for controlling the operation of said transmission switching rollers on the basis of a detection signal outputted from said detector.

20. A substrate-attitude control system as set forth in claim 19, wherein said controller is capable of controlling the operation of said rotation driving source.

21. A substrate-attitude control system as set forth in claim 19, wherein said rotation transmitting rollers are integral with said transmission switching rollers.

22. A substrate-attitude control system as set forth in claim 19, wherein said holding member comprises one or a plurality holding rods having holding grooves for holding said substrates so that said substrates are able to be supported in said holding grooves of at least one of said holding rods.

23. A substrate-attitude control system as set forth in claim 19, wherein said holding member comprises a plurality of holding rods, at least one of which has holding grooves for supporting thereon said substrates, each of said holding grooves of said at least one of said holding rods having a substantially V-shaped cross section, and each of the other holding rods having holding grooves, each of which has a substantially Y-shaped cross section.

24. A substrate-attitude control system as set forth in claim 19, which further comprises drive transmitting roller which is provided between said rotation driving source and said transmission switching rollers and which is driven by said rotation driving source via a timing belt.

25. A substrate-attitude control system as set forth in claim 19, wherein said rotation driving source comprises a stepping motor.

* * * * *